(12) United States Patent
Abe

(10) Patent No.: US 7,456,082 B2
(45) Date of Patent: Nov. 25, 2008

(54) METHOD FOR PRODUCING SILICON SINGLE CRYSTAL AND SILICON SINGLE CRYSTAL

(75) Inventor: Keisei Abe, Tokyo (JP)

(73) Assignee: Sumco Corporation, Tokyo (JP)

( * ) Notice: Subject to any disclaimer, the term of this patent is extended or adjusted under 35 U.S.C. 154(b) by 29 days.

(21) Appl. No.: 11/492,705

(22) Filed: Jul. 24, 2006

(65) Prior Publication Data
US 2007/0028833 A1 Feb. 8, 2007

(30) Foreign Application Priority Data
Jul. 25, 2005 (JP) ............... P2005-214236

(51) Int. Cl.
*H01L 21/30* (2006.01)
*H01L 21/46* (2006.01)

(52) U.S. Cl. .......... 438/459; 438/48; 438/57; 438/463; 257/E47.003; 257/E43.004; 257/E31.001

(58) Field of Classification Search ............ 438/459, 438/48, 57, 463; 257/108, 421, E47.003, 257/E43.004, E31.001; 117/50
See application file for complete search history.

(56) References Cited

U.S. PATENT DOCUMENTS

| | | | | |
|---|---|---|---|---|
| 5,556,461 | A | * | 9/1996 | Kimura et al. ............... 117/51 |
| 6,334,896 | B1 | | 1/2002 | Iida et al. |
| 2003/0041796 | A1 | * | 3/2003 | Nakamura et al. ............ 117/13 |

FOREIGN PATENT DOCUMENTS

| | | |
|---|---|---|
| JP | 64-024090 | 1/1989 |
| JP | 2000-154093 | 6/2000 |

* cited by examiner

*Primary Examiner*—Walter Lindsay, Jr.
*Assistant Examiner*—Abdulfattah Mustapha
(74) *Attorney, Agent, or Firm*—Kolisch Hartwell, PC

(57) ABSTRACT

In a method for producing a silicon single by pulling the silicon single crystal from a silicon melt contained in a crucible, a magnetic field is applied to the silicon melt in a radial direction of the silicon single crystal, and a vertical level of a center of the magnetic field relative to a surface of the silicon melt is controlled such that a thermal gradient in an axial direction of the crystal is maintained at a constant value in respective portions along a radial direction of the silicon single crystal.

2 Claims, 6 Drawing Sheets

METHOD FOR PRODUCING SILICON SINGLE CRYSTAL AND SILICON SINGLE CRYSTAL

BACKGROUND OF THE INVENTION

1. Field of the Invention

The present invention relates to a method for producing a silicon single crystal which facilitates a production of silicon single crystals which show, throughout the entire length of the crystal, small heterogeneity in radial distribution of crystal defects and provides a radial section entirely composed of a single type crystal defect region. The invention also relates to a silicon single crystal produced by the same method Priority is claimed on Japanese Patent Application No. 2005-214236, filed Jul. 25, 2005, the content of which is incorporated herein by reference.

2. Description of the Related Art

A silicon single crystal may be produced through the Czochralski method (CZ method) in which a silicon single crystal is grown by pulling the silicon single crystal from a silicon melt In the CZ method, a polycrystalline silicon raw material is charged in a crucible, and is heated to a molten state by a heater, thereby forming a silicon melt. Subsequently, a silicon single crystal may be grown by pulling the silicon single crystal from the silicon melt. A silicon substrate may be produced by slicing a silicon single crystal produced by the above-described method. Along with the recent trend of downsizing semiconductor elements in accordance with development of highly integrated semiconductor circuits, there is an increasing demand for quality-improvement of silicon single crystals as a substrate of semiconductor circuits.

Conventionally, a pulling method using an applied magnetic field (MCZ method) is known as a method for suppressing silicon melt convection and for providing a homogeneous silicon single crystal (e.g., Patent Reference 1: Japanese Unexamined Patent Application, First Publication, No.S64-24090).

As s a well known phenomena, a silicon single crystal produced by a conventional CZ method comprises a plurality of types of crystal defect regions including: an interstitial silicon-type point defect region (hereafter referred to as I region ) in which interstitial silicon (silicon atom as interstitial atom)-type point defects dominantly occur; a vacancy-type defect region in which vacancy-type point defects dominantly occur and aggregates of vacancy-type point defects occur (hereafter referred as V region); a perfect region (hereafter referred to as P region) in which aggregates of interstitial silicon-type point defects and aggregates of vacancy type point defects do not occur; a region (hereafter referred as OSF region) in which nuclei of oxidation induced stacking fault (OSF) occur. The OSF region occurs between P region and V region and shows a ring-like distribution in a section perpendicular to a direction of crystal growth.

Controlling of the growth conditions of a silicon single crystal has been proposed as a method for producing a silicon single crystal from which a radial section entirely composed of a P type region can be obtained (e.g., Patent Reference 2; Japanese Unexamined Patent Application First Publication, No. 2000-154093).

However, in the technique of Patent Reference 2, because of the very narrow range of preferable conditions such as pulling rate and thermal gradient, it has been difficult to control the conditions to obtain a defect-free crystal. Such difficulty causes a problem in practical production of defect-free crystals. The technique of Patent Reference 1 has an objective of increasing the oxygen concentration in a silicon single crystal without reducing the pulling rate of the crystal. By the technique of Patent Reference 1, it is impossible to pull a silicon single crystal radial section of which is entirely composed of a single type of defect region.

In view of the abovedescribed circumstances, an object of the invention is to provide a method for producing a silicon single crystal, which facilitates the production of silicon single crystals, throughout the entire length thereof, showing small heterogeneity in radial distribution of crystal defects and providing a radial section entirely composed of a single type crystal defect region. The invention also aims to realize a silicon single crystal produced by the same method which shows a radial section entirely composed of a single type crystal defect region.

SUMMARY OF THE INVENTION

In the invention, in order to solve the above-described problem, a method for producing a silicon single crystal by pulling a silicon single crystal from a silicon melt contained in a crucible comprises: applying a magnetic field to the silicon single crystal in a radial direction of the silicon single crystal; and controlling a vertical level of a center of the magnetic field relative to a surface of the silicon melt such that a thermal gradient in an axial direction of the silicon single crystal is maintained at a constant value in respective portions along a radial direction of the silicon single crystal.

In the above-described method for producing a silicon single crystal, it is preferable that the method comprises: performing a determination of conditions of a magnetic field, and growing a silicon single crystal while controlling the vertical level of a center of the magnetic field relative to a surface of the silicon melt in accordance with the above-described conditions of the magnetic field. In this case, the conditions of the magnetic field may be determined by: performing a test pulling of a silicon single crystal while alteing the pulling rate within a range of 0.2 mm/minute to 0.6 mm/minute; growing a first crystal defect region and a second crystal defect region along an axial direction of the silicon single crystal, the first and second crystal defect region respectively having states of crystal defects which are different from each other; determining the conditions of the magnetic field such tat an interface between the first crystal defect region and the second crystal defect region shows a shape satisfying L/D=35/300 to 105/300, where L is a spacing between an axial position of the interface at the center of the crystal ant an axial position of the interface at the periphery of the crystal, and D is the diameter of the crystal.

In the above-described method for producing a silicon single crystal, the second crystal defect region may be a P region in which aggregates of vacancy-type point defects and aggregates of interstitial silicon-type point defects do not occur.

In addition, in order to solve the above-described problem, a silicon single crystal may be produced by any one of the above-described methods for producing a silicon single crystal.

In the above-described method for producing a silicon single crystal, when a silicon single crystal is grown by pulling the silicon single crystal from a silicon melt contained in a crucible, a magnetic field is applied in a radial direction of the silicon single crystal. At that time, a vertical level of the center of the magnetic field is controlled relative to the surface of the silicon melt such that a thermal gradient (hereafter referred to as an axial thermal gradient) in the silicon single crystal from a solid-liquid interface to the axial direction of the crystal is maintained at a constant value in respective portions along the radial direction of the crystal. Therefore, the axial thermal gradient may be controlled so as to have a constant value by the effect of a magnetic field application on the control of convection of the silicon melt or the like. In addition, since the vertical level of the center of the magnetic field is determined in accordance with the level relative to the surface level of the melt, even though the surface level of the melt is changed accompanied by the growth of the silicon single crystal, the thermal gradient in the radial direction in the silicon single crystal can be maintained at a small value during the entire pulling process, that is, throughout the entire length of the silicon single crystal.

As a result, in different portions along a redial direction, variation in axial thermal gradient in the silicon single crystal can be effectively reduced and variation in crystal defect distribution in the radial direction of the crystal can be suppressed effectively. Therefore, it is possible to homogenize the occurrence of crystal defects in the radial direction of the silicon single crystal, thereby easily providing a silicon single crystal of which a radial section is entirely composed of a single type of crystal defect region. As a result, it is possible to produce a silicon wafer showing homogeneous properties in the radial direction.

In addition, in the above-described method for producing a silicon single crystal, the above-described state of the magnetic field may be controlled strictly based on the result of a V-type test pulling. Firstly, in the V-type pulling test, the pulling rate of the silicon single crystal is changed within a range from 0.2 to 0.6 mm/minute. Subsequently, an interface between a first crystal defect region and a second crystal defect region grown subsequently to the first defect region is observed. At that time, the test sample of the silicon single crystal grown by the V-type test pulling is cut along the pulling axis such that a center axis of the crystal is observed in the section, and variation in occurrences of respective defect regions along the growth axis of the crystal is examined. If constant thermal conditions are maintained in the radial direction of the crystal the occurrence of respective crystal defect regions corresponds only to the change in the pulling rate and does not show radial variation. In such a case, an interface of a crystal defect region is expected to show a straight-line appearance along the radial direction in a section of the crystal. In practice, various conditions such as the axial thermal gradient differ along the radial direction. As a result, a crystal defect region has an interface protruding downward or upward along the longitudinal axis of a crystal. In order to evaluate the difference in the above-described conditions in the radial direction of the crystal, a spacing (spacing along the axial direction of the crystal) L between an axial position of the interface at a center of the crystal and an axial position of the interface at a periphery of the crystal is measured. In order to determine the vertical position of the center of the magnetic field relative to the melt surface, a plurality of V-type pulling tests are performed until a ratio of the spacing L mm and a diameter D mm of the silicon single crystal satisfies L/D=35/300 to 105/300. Under these conditions, thermal deviation in the radial direction of the crystal is sufficiently reduced duing the crystal growth.

In a practical production of silicon single crystals, the magnetic field is maintained under the predetermined conditions described above, and a silicon single crystal is pulled at a predetermined pulling rate.

In the above-described method for producing a silicon single crystal, the vertical position of the center of the magnetic field relative to the melt surface is controlled so as to have a predetermined value. The predetermined position of the center of the magnetic field is determined such that in a silicon single crystal grown by a V-type pulling test using a pulling rate in a range of 0.2 to 0.6 mm/minute, an interface between a first crystal defect region and subsequently grown second crystal defect region shows a shape satisfying L/D=35/300 to 105/300, where L is an interval (difference in axial position) between an axial position of the interface at the center of the crystal and an axial position of the interface at a periphery of the crystal, and D is the diameter of the crystal. Under the above-described conditions for a magnetic field, it is possible to further enhance the effect of the magnetic field for suppressing melt convection so as to maintain an axial thermal gradient in the silicon single crystal at a constant value in respective portions distributed along the radial direction.

As a result, it is easy to provide a silicon single crystal in which an entire surface of a radial section of the crystal is composed of a single type of crystal defect region, for example, the above-described second crystal defect region.

In the above-described method for producing a silicon single crystal, it is not preferable to apply a magnetic field causing an LID value in excess of 105/300. When the L/D value exceeds 105/300 in a V-type pulling test, the axial distribution of crystal defects shows large heterogeneity. Therefore, it is difficult to obtain a silicon single crystal of which a radial section is entirely composed of the second crystal defect region. As the L/D value is decreased, it is easy to produce a silicon single crystal having a small heterogeneity in the radial distribution of crystal defects in a crystal. However, it is difficult to control the pulling conditions such that a silicon single crystal grown by a V-type pulling test shows an L/D value smaller than 35/300.

In the above-described method for producing a silicon single crystal, it is possible to control the conditions of the magnetic field such that the above-described limitation (L/D=35/300 to 105/300) is satisfied in a V-type pulling test where the second crystal defect region is a P region which is free of aggregates of vacancy-type defects and aggregates of interstitial silicon-type defects. Under such conditions, it is easy to produce a silicon single crystal of which a radial section is entirely composed of the P region. By slicing such a silicon single crystal, it is easy to obtain a silicon wafer having an entirely defect-free surface.

In a V-type pulling test where the second crystal defect region is a P region, the first crystal defect region may be an I region or a ring-like OSF region adjacent to a V region. The type of crystal defects in the first crystal defect region depends on the change in pulling rate (increasing pulling rate or decreasing pulling rate ) in the V-type pulling test for forming the portion including the interface subjected to observation. In the above-described method for producing a silicon single crystal, the status of crystal defects in the first crystal defect region is not limited as long as the shape of the interface of the first defect region can be regulated.

In the above-described method for producing a silicon single crystal, the shape of the interface between the first defect region and the second defect region is regulated based on the difference in the axial position of the interface between the center of the interface and the periphery of the interface. Since radial distributions of the V region, ring-like OSF region, and I region are respectively changed in accordance with a change in the pulling rate, it is possible to use a shape of any of the above-described regions to determine the pulling conditions for a single crystal having a homogeneous distribution of crystal defects in the radial direction of the crystal.

In the pulling test in the above-described method for producing a silicon single crystal, a silicon single crystal is grown while firstly decreasing and subsequently increasing the pulling rate within a predetermined range. In such a case, the relationship between the pulling rate and axial position in the crystal is shown by a V-like line in a graph showing the pulling rate on the vertical axis and corresponding axial positions in the crystal on the horizontal axis. Therefore, the above-described pulling test is referred to as a V-type pulling test.

A silicon single crystal of the invention is grown by the above-described method for producing a silicon single crystal. Therefore the silicon single crystal has excellent properties such that a radial section of the silicon single crystal is entirely composed of a single type-crystal defect region.

In the abovedescribed method for producing a silicon single crystal, suppressing silicon melt convection by application of a magnetic field is effectively used to maintain an axial thermal gradient in the silicon single crystal at a at a constant value in respective portions distributed along the radial direction. As a result, heterogeneity in the radial distribution of crystal defects can be reduced. Therefore, it is easy to produce a silicon single crystal of which a radial section is entirely composed of a single crystal defect region.

DETAILED DESCRIPTION OF THE INVENTION

Figure 1:
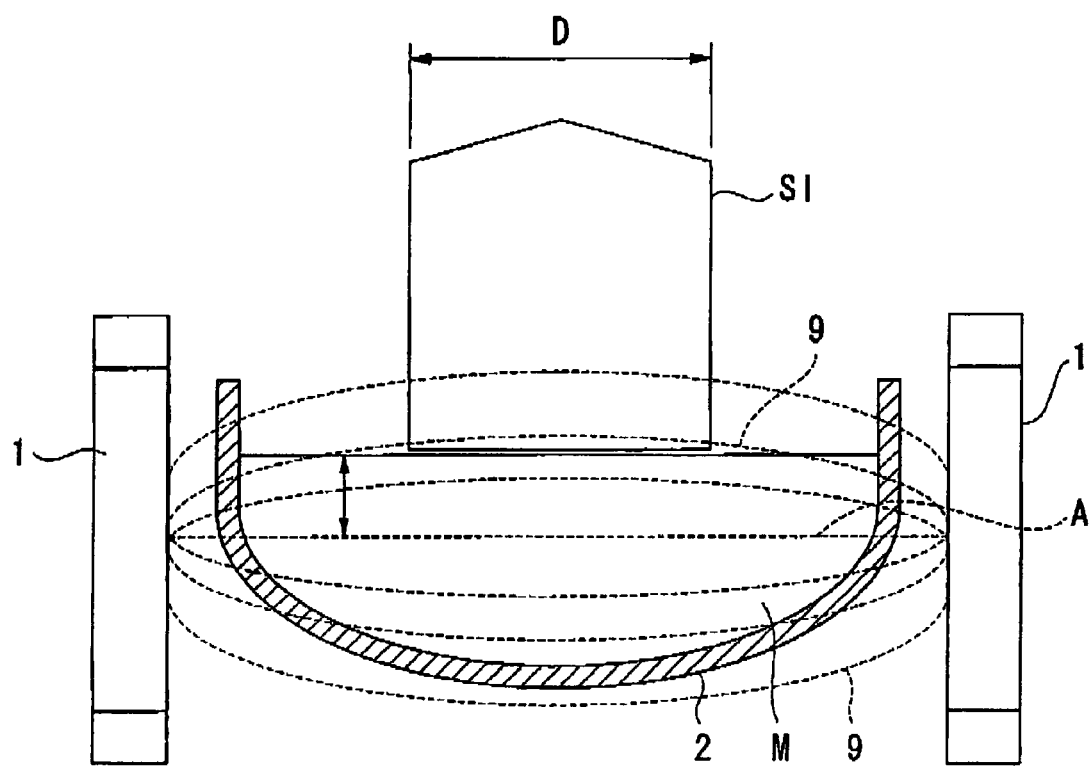
FIG. 1 is a schematic cross-sectional view of an apparatus for producing a silicon single crystal, which is used in a method for producing a silicon single crystal in accordance with a first embodiment of the invention.

In the following, a method for producing a silicon single crystal and a silicon single crystal in accordance with an embodiment of the invention are explained in detail with reference to the drawings. FIG. 1 is a schematic cross-sectional view of an apparatus for producing a silicon single crystal, which is used in a method for producing a silicon single crystal in accordance with a first embodiment of the invention In FIG. 1, a crucible made of quartz is shown by reference symbol 2. A pair of magnetic coils 1, 1 is placed in counter arrangement with a predetermined spacing in between on both side of the crucible. In addition the crucible 2 is surrounded by a cylindrical heater (not shown) which is placed between the crucible 2 and the magnetic coils 1, 1 with a predetermined spacing intervened between the crucible 2 and the heater.

The crucible 2 contains a silicon melt M which is formed by charging the crucible with a polycrystalline silicon of high purity and heating and melting the polycrystalline silicon by the heater. By a pulling wire (not shown), a silicon single crystal SI is hoisted down towards the rotation center of the crucible 2 such that a bottom face of the crystal makes contact with a surface of the silicon melt M.

Being connected to a crucible-driving unit (not shown), the crucible 2 may be rotated in a horizontal plane, and may be moved upward and downward along a vertical direction in accordance with the change in surface level of the silicon melt M. The magnetic coils 1, 1 are also removable upward and downward by magnetic coil driving units, and a vertical position of the center A of the magnetic field can be controlled in accordance with the change in the level of the melt surface.

In a production process of a silicon single crystal SI using the above-described apparatus, firstly, the polycrystalline silicon contained in the crucible 2 is heated by the heater and made molten to form the silicon melt M, and the silicon melt M is maintained at a predetermined temperature. The silicon melt is controlled so as to have a predetermined temperature. Next, a magnetic field 9 is applied from the magnetic coils 1, 1 to a radial direction of the silicon single crystal. The pulling wire, the end of which is attached with a seed crystal, is hoisted down such that a bottom surface of the seed crystal makes contact with the surface of the silicon melt M. After that, the seed crystal is pulled up so as to grow a silicon single crystal beneath the seed crystal.

At that time, the vertical position of a center A of the magnetic field 9 relative to the surface of the silicon melt M is controlled such that an axial thermal gradient in the silicon single crystal is maintained at a constant value in respective portions along a radial direction of the crystal. More specifically, when a silicon single crystal including an OSF region and P region is grown while altering the pulling rate within a range of 0.2 to 0.6 mm/minute during a test pulling, a relative height (spacing along longitudinal axis) L mm of the OSF-region-P-region interface at a periphery of the crystal and at a central portion of the crystal and a diameter D mm of the silicon single crystal satisfy the formula: L/D=35/300 to 105/300.

In the above-described method for producing a silicon single crystal, the magnetic flux density at the center of the magnetic coils 1, 1, radius of the magnetic coils 1, 1, distance between the magnetic coils 1, 1 and the crucible 2, and the distance between the two magnetic coils 1, 1 are respectively set in accordance with the production conditions or the like.

EXAMPLE

Figure 2:
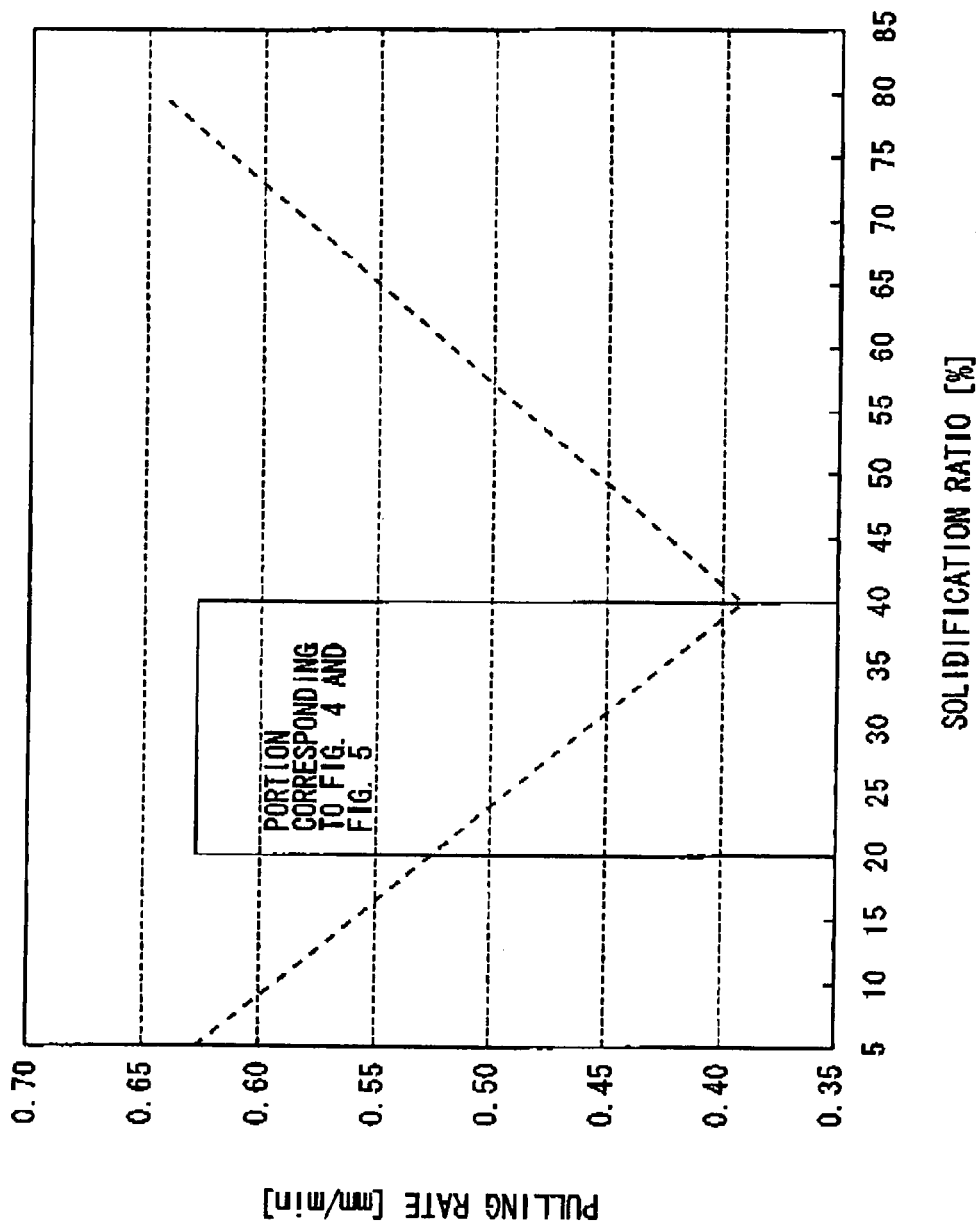
FIG. 2 is a graph showing a relationship between a solidification ratio of a silicon melt M and pulling rate of a silicon single crystal SI.
Figure 3:
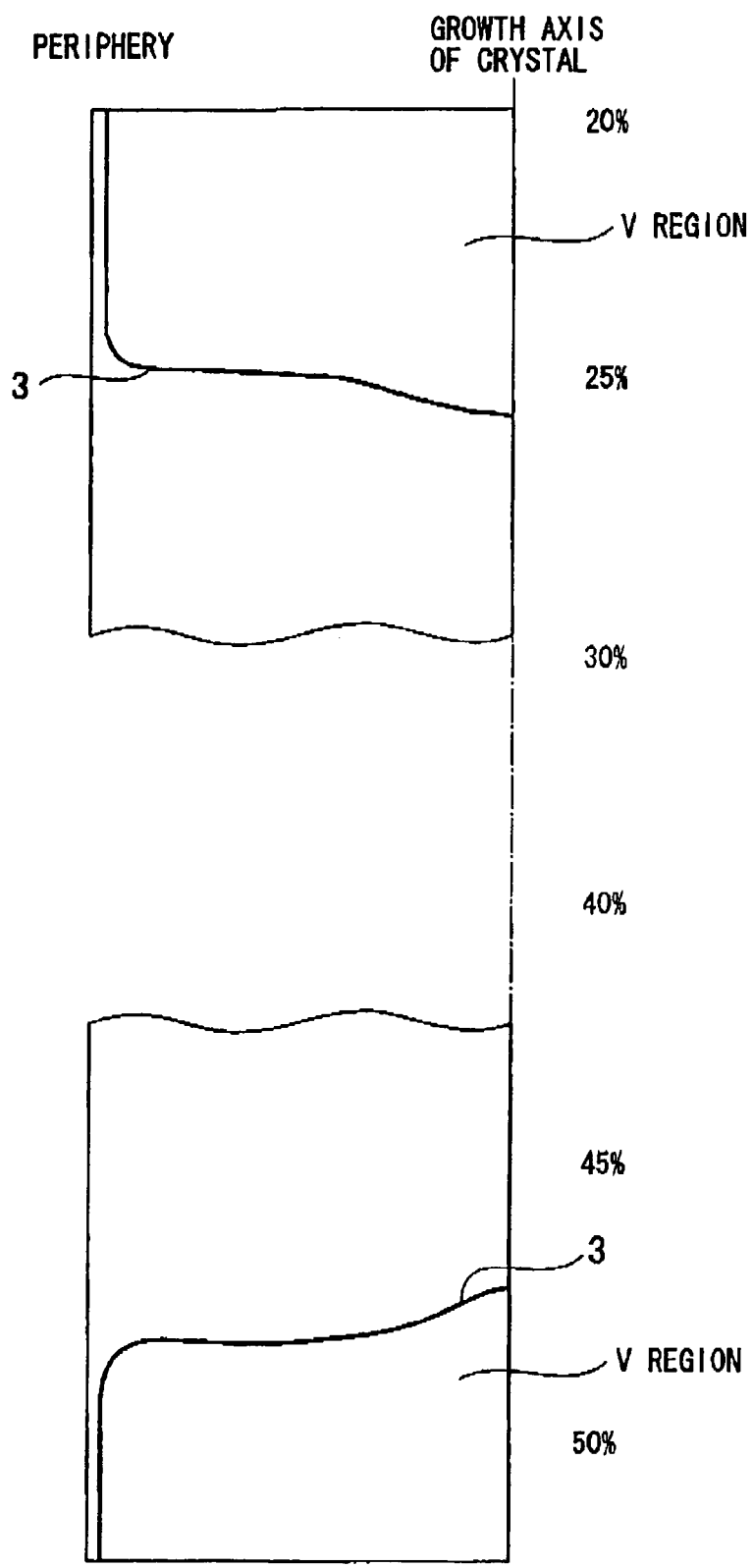
FIG. 3 is a drawing showing a distribution of crystal defects on a section along a growth axis of a silicon single crystal in a example according to the invention.
Figure 4:
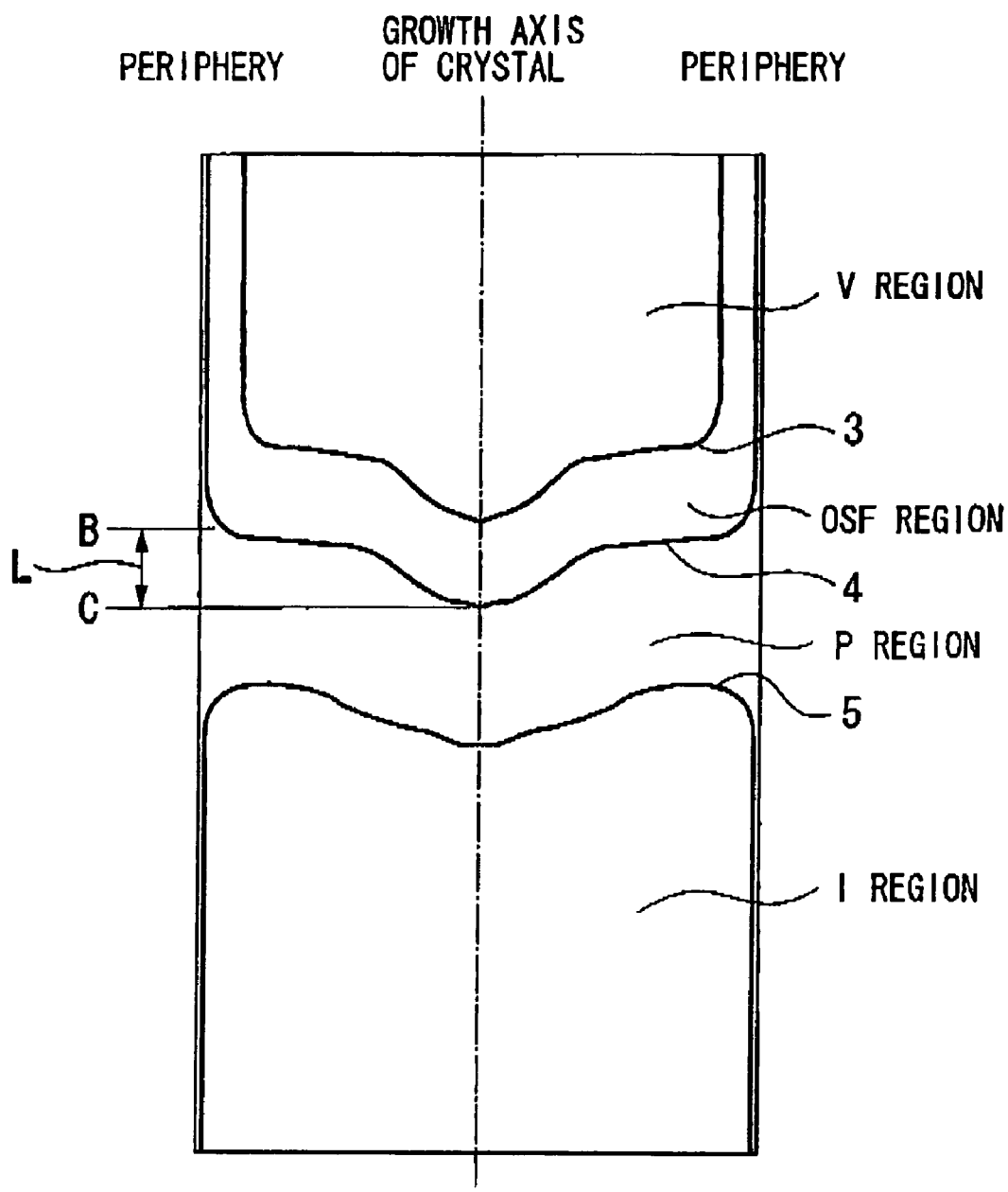
FIG. 4 is a drawing showing a distribution of crystal defects on a section along a growth axis of a silicon single crystal according to an example of the invention, where the drawing shows a distribution of crystal defects in a portion corresponding to solidification ratio of 20 to 40% shown in FIG. 2.

A silicon single crystal SI having a diameter D of 300 mm was produced under the following conditions. The vertical position of the center A of the magnetic field 9 was 130 mm lower than a surface of the silicon melt M. The magnetic flux density at the center of magnetic coils 1, 1 was 0.2 to 0.4 tesla. During the crystal growth, the crucible was rotated at a rate of about 0.1 to 20 cycle/minute, and the silicon single crystal SI was reversely rotated at a rotation rate of about 1 to 25 cycle/minute. Under the above-described conditions, the silicon melt M was solidified while alteing the pulling rate of the silicon single crystal as shown in FIG. 2. FIG. 3 and FIG. 4 show the distribution of crystal defects on sections along the growth axis.

FIG. 3 is a drawing showing the distribution of crystal defects on a section along a growth axis of a silicon single crystal. A portion corresponding to a solidification ratio of 20 to 50% shown in FIG. 2 is indicated in FIG. 3. It should be noted that FIG. 3 only illustrates half (from the periphery to the center axis) of the section along the growth axis of the silicon single crystal SI. FIG. 4 shows the distribution of crystal defects in a portion corresponding to a solidification ratio of 20 to 40% shown in FIGI 2. In the above-description, the solidification ratio is defined as (mass of a crystal which has been pulled/mass of raw material charged in a crucible)× 100.

As shown in FIG. 4, from the start of crystal growth until the time when the pulling rate is decreased to about 0.5 mm/minute (corresponding to a solidification ratio of about 25%), the crystal has a crystal defect distribution in which a V region is surrounded by an OSF region. During the above-described period, a V-OSF interface 3 formed as an interface between the V region and the OSF region develops in parallel to the direction of the growth axis of the crystal. At the stage of a pulling rate of 0.48 mm/minute, the interface 3 shows a gentle slope from the periphery to the center.

At a pulling rate of 0.45 mm/minute, a P region appears to develop, and P-OSF interface 4 as an interface between the P region and the OSF region is formed The shape of the P-OSF interface 4 is almost the same as that of the V-OSF interface 3 and forms a gentle slope from the periphery to the central portion of the crystal. In this example, a spacing (difference in height) L in the axial direction between the height (axial position) B of the P-OSF interface 4 at a periphery of the crystal and the height C of the POSF interface at a central portion of the crystal was 35 mm. As described above, the silicon single crystal SI had a diameter D of 300 mm. Therefore, L/D =35/300 was satisfied.

At a pulling rate of 0.40 mm/minute, an I region began to develop in the crystal, and a P-I interface 5 was formed as a interface between the P region and I region. The P-I interface 5 forms a gentle slope from the periphery to the central portion of the crystal.

As shown in FIG. 2 to FIG. 4, by growing a silicon single crystal SI in accordance with the above-described conditions of the example, a silicon single crystal SI was produced so as to have a distribution of crystal defect such that the V-OSF interface 3, P-OSF interface 4, P-I interface 5 respectively formed a gentle slope from the periphery to the central portion of the crystal. From the pulling conditions of the above-described silicon single crystal SI, it is easy to obtain production conditions for silicon single crystals in which the distribution of crystal defects barely changes in the radial direction.

From FIG. 2, FIG. 3, and FIG. 4, it was confirmed that by setting the pulling rate of a silicon single crystal to be about 0.45 mm/minute in the above-described embodiment conditions, the whole length of the crystal could provide a radial section entirely composed of a P region.

Conventional Example

A silicon single crystal was produced in accordance with the conditions of the example except that a vertical position of the center A of the magnetic field 9 was maintained at 230 mm lower than the surface of the silicon melt M. The distribution of crystal defects on a section along the growth axis of the crystal is shown in FIG. 5 and FIG. 6.

Figure 5:
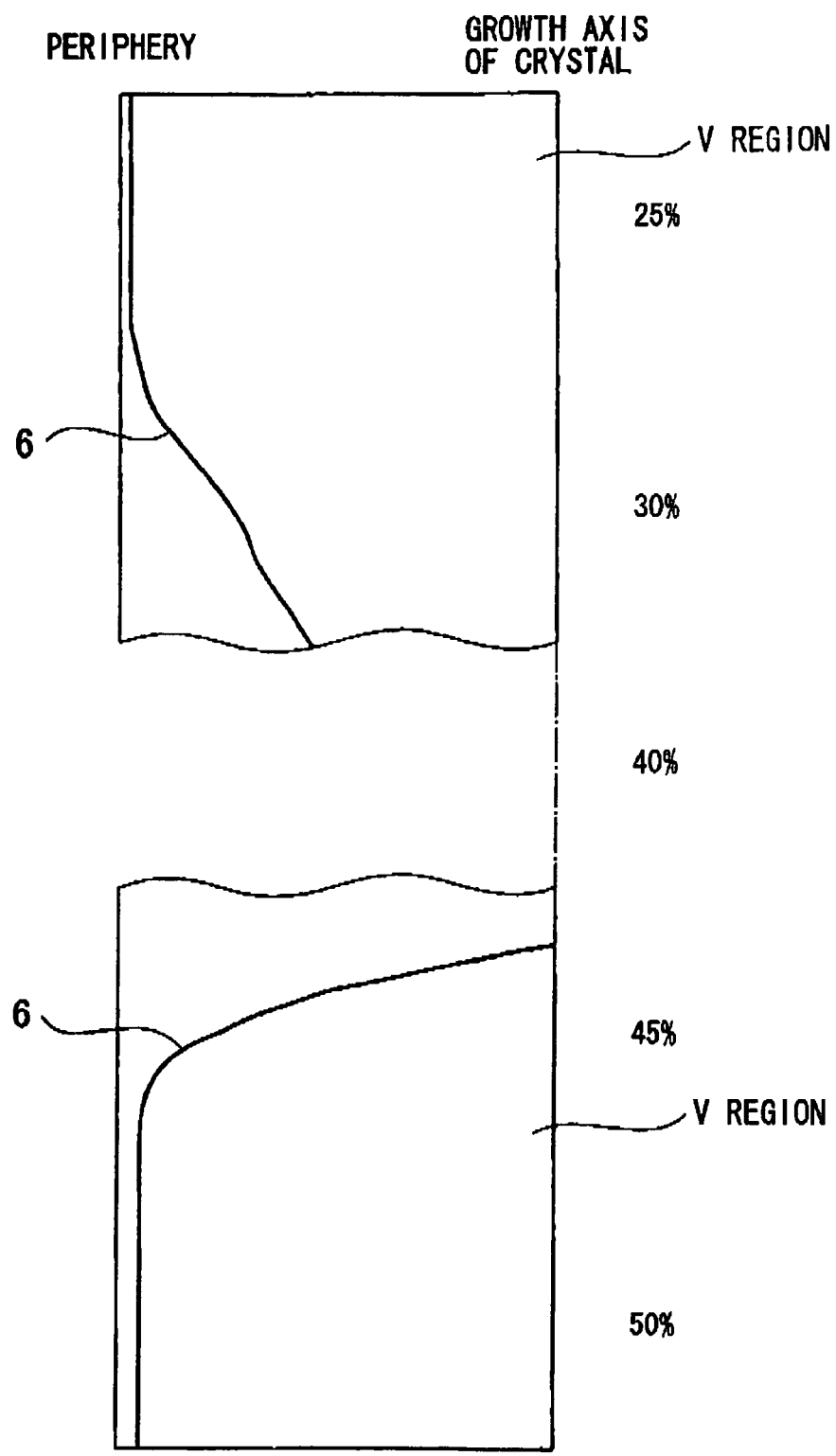
FIG. 5 is a drawing showing a distribution of crystal defects on a section along a growth axis of a silicon single crystal according to the prior art.

FIG. 5 is a drawing showing the distribution of crystal defects on a section along the growth axis of a silicon single crystal. A portion corresponding to a solidification ratio of 20 to 50% shown in FIG. 2 is indicated in FIG. 5. It should be noted that FIG. 5 illustrates half (from the periphery to the center axis) of the section along the growth axis of the silicon single crystal SI. FIG. 6 shows the distribution of crystal defects in a portion corresponding to a solidification ratio of 20 to 40% shown in FIG. 2.

Figure 6:
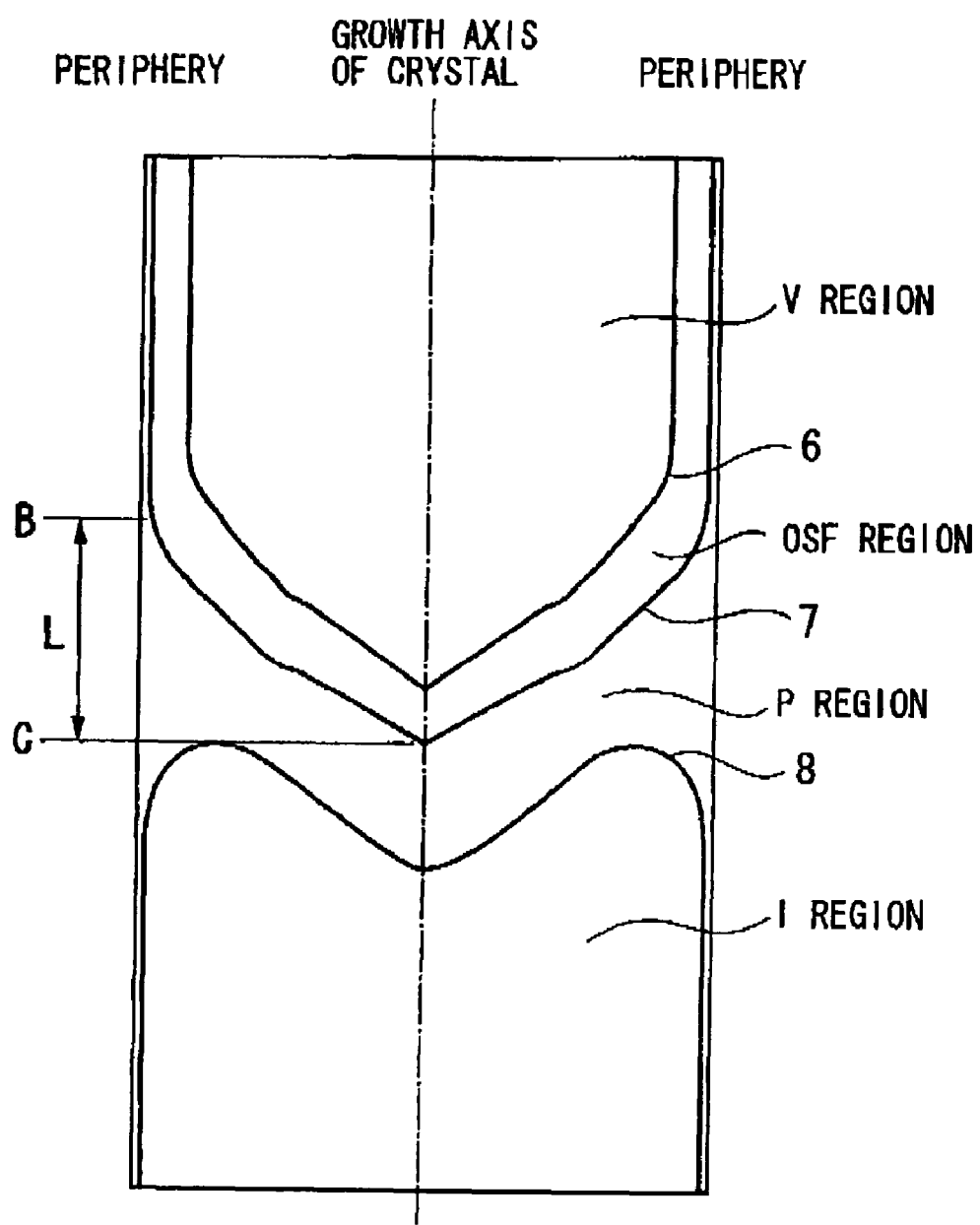
FIG. 6 is a drawing shoving a distribution of crystal defects on a section along a growth axis of a silicon single crystal according to the prior art, where the drawing shows the distribution of crystal defects in a portion corresponding to a solidification ratio of 20 to 40% shown in FIG. 2.

As shown in FIG. 5 and FIG. 6, by growing a silicon single crystal in accordance with the above-described conditions of the conventional example, a silicon single crystal SI was produced so as to have V-OSF interface 6, P-OSF interface 7, P-4 interface 8, all of which forming a relatively steep slope from the periphery to the central portion of the crystal compared to the example shown in FIG. 3 and FIG. 4. The silicon single crystal SI of the conventional example showed larger variation in radial distribution of crystal defects than that of the example of the invention.

In addition, as shown in the comparison of FIG. 3 and FIG. 5, the steepness of an inclination of the V-OSF interface from the periphery to the center of the crystal is reduced in the embodiment compared to the comparative example.

In addition, the difference L between the height B of the POSF interface 7 at the periphery of the crystal and a height C of the POSF interface 7 at the central portion of the crystal was 150 mm. In the above-description, the difference in height corresponds to a relative position along the growth axis of the crystal. Since the silicon single crystal SI had a diameter of 300 mm, the L/D value satisfied L/D=150/300. The value exceeded the upper limit of the preferable range of L/D=35/300 to 105/300.

FIG. 5 and FIG. 6 clearly indicate that, under the above-described conditions for the conventional example, it was impossible to provide a silicon single crystal from which a radial section entirely composed of a P region could be obtained.

While preferred embodiments of the invention have been described and illustrated above, it should be understood that these are exemplary of the invention and are not to be considered as limiting. For example, although in the above-described embodiment a silicon melt is grown under conditions such that a silicon melt is subjected to a magnetic field in radial direction of the silicon single crystal, it is possible to apply a cusp magnetic field in addition to the horizontal magnetic field, and grow a silicon single crystal SI under such conditions. There is no limitation on the diameter of a silicon single crystal produced by a method of the invention. Therefore, it is possible to pull a silicon single crystal having any desired diameter. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for producing a silicon single crystal by pulling a silicon single crystal from a silicon melt contained in a crucible, the method comprising:

applying a magnetic field to the silicon melt in a radial direction of the silicon single crystal;

controlling a vertical level of a center of the magnetic field relative to a surface of the silicon melt such that a thermal gradient in an axial direction of the silicon single crystal is maintained at a constant value in respective portions along a radial direction of the silicon single crystal; and performing a determination of conditions of a magnetic field by:

performing a test pulling of a silicon single crystal while altering a pulling rate within a range of 0.2 mm/minute to 0.6 mm/minute;

growing a first crystal defect region and a second crystal defect region along an axial direction of the silicon single crystal, the first and second crystal defect region respectively having states of crystal defects which are different from each other;

determining the conditions of the magnetic field such that an interface between the first crystal defect region and the second crystal defect region shows a shape satisfying $L/D=35/300$ to $105/300$, where L is a spacing between an axial position of the interface at the center of the crystal and an axial position of the interface at the periphery of the crystal, and D is the diameter of the crystal; and growing a silicon single crystal while controlling the vertical level of the center of the magnetic field relative to a surface of the silicon melt in accordance with the above-described conditions of the magnetic field.

2. A method for growing a silicon single crystal according to claim 1, wherein the second crystal defect region is a perfect region in which aggregates of vacancy-type point defects and aggregates of interstitial silicon-type point defects do not exist.

* * * * *